United States Patent
Won

(10) Patent No.: US 7,440,346 B2
(45) Date of Patent: Oct. 21, 2008

(54) SEMICONDUCTOR DEVICE

(75) Inventor: Sam Kyu Won, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/617,200

(22) Filed: Dec. 28, 2006

(65) Prior Publication Data

US 2008/0084772 A1    Apr. 10, 2008

(30) Foreign Application Priority Data

Sep. 29, 2006    (KR) .................. 10-2006-0096210

(51) Int. Cl.
 *G11C 29/00* (2006.01)
(52) U.S. Cl. .................. 365/201; 365/189.07; 365/226
(58) Field of Classification Search .................. 365/240
 See application file for complete search history.

(56) References Cited

U.S. PATENT DOCUMENTS

| 5,559,734 | A | * | 9/1996 | Saito | 365/168 |
|---|---|---|---|---|---|
| 5,812,455 | A | * | 9/1998 | Iwata et al. | 365/185.18 |
| 6,542,404 | B2 | * | 4/2003 | Pierin et al. | 365/185.03 |
| 6,654,290 | B2 | * | 11/2003 | Lee et al. | 365/185.23 |
| 7,180,787 | B2 | * | 2/2007 | Hosono et al. | 365/185.24 |
| 2004/0145947 | A1 | * | 7/2004 | Micheloni et al. | 365/185.19 |
| 2005/0213385 | A1 | * | 9/2005 | Hosono et al. | 365/185.17 |
| 2006/0146612 | A1 | * | 7/2006 | Lim et al. | 365/185.21 |
| 2007/0274133 | A1 | * | 11/2007 | Byeon | 365/185.23 |

FOREIGN PATENT DOCUMENTS

KR    100179852 B1    11/1998

* cited by examiner

*Primary Examiner*—Tan T. Nguyen
(74) *Attorney, Agent, or Firm*—Townsend and Townsend and Crew LLP

(57) ABSTRACT

A semiconductor memory device includes a high voltage generator for generating a high voltage and applying the generated high voltage to a memory unit, a converter for converting an output voltage of the high voltage generator into a digital signal, and a mode selection unit for outputting an output of the converter or an output of the memory unit through an I/O terminal selectively.

9 Claims, 4 Drawing Sheets

SEMICONDUCTOR DEVICE

CROSS-REFERENCES TO RELATED APPLICATIONS

The present application claims priority to Korean patent application number 10-2006-96210, filed on Sep. 29, 2006, which is incorporated by reference in its entirety.

BACKGROUND OF THE INVENTION

The present invention relates to semiconductor devices and, more particularly, to a semiconductor device capable of testing a high voltage even after packaging.

In general, in semiconductor devices using a high voltage, a high voltage is tested and measured on a wafer in which elements are formed. This is a method of determining whether a high voltage is abnormal by performing the test before packaging. The high voltage is generally measured using a probe. The high voltage is measured according to the flowchart illustrated in FIG. 1.

FIG. 1 is a flowchart illustrating a method of measuring a high voltage of a conventional semiconductor device. A general high voltage test includes a test mode setup step P11, a high voltage generator enable step P12, a high voltage measured bit enable step P13, a measuring pad measurement step P14, and a high voltage generator disable step P15.

In particular, a target semiconductor device is set to test mode at step P11. At this time, the semiconductor device is tested on a wafer before packaging. A test signal is enabled using the high voltage generator at step P12. A measured bit signal for a high voltage test is enabled at step P13. The measurement pad compares the high voltage measured bit and a reference signal level to measure the difference at step P14, which tests the high voltage. After the measurement, the high voltage generator is disabled at step P15, thus finishing the high voltage test.

The high voltage test is performed according to the flowchart illustrated in FIG. 1, and a measurement thereof may vary. Before the test is performed on the wafer level, the level of an internally generated high voltage is measured, and is then compared with the required target level. A trimming circuit compensates for the difference between the level of the internally generated high voltage and the target level in order to set the level of the internally generated high voltage to a target value.

A general high voltage test method includes a first method of directly connecting a measurement probing pin to a mini-pad within a chip, and measuring a high voltage using an oscilloscope, and a second method of connecting an equipment apparatus to a measurement pad (referred to as "VEXTPAD") to read a high voltage. The first method is generally used for design analysis. The second method is used to read an initial value for a wafer trimming, and is used for mass production.

However, if measurement and trimming in a wafer state are completed and packaging is completed through a packaging process, the mini-pad within the chip, and the measurement pad VEXTPAD cannot be electrically connected to external pins. It makes it very difficult to measure the high voltage. Thus, in the case where the high voltage circuit must be tested since abnormalities may occur in the operation of the device after packaging, the packaging has to be peeled off and the measurement has to be performed again. Furthermore, if the high voltage is measured through the pad, numerous measurement errors may occur due to the introduction of noise between the oscilloscope and the probe.

BRIEF SUMMARY OF THE INVENTION

The present embodiment provides a semiconductor device in which an Analog to Digital Converter (ADC) is included in a circuit in order to measure the high voltage to check for abnormality in the high voltage after the packaging process as well as in the wafer state.

In one embodiment, a semiconductor memory device includes a high voltage generator for generating a high voltage and applying the generated high voltage to a memory unit, a converter for converting an output voltage of the high voltage generator into a digital signal, and a mode selection unit for outputting an output of the converter or an output of the memory unit through an I/O terminal selectively.

In another embodiment, a high voltage test method of a semiconductor memory device includes the steps of, when a mode select signal is enabled, changing mode from general data mode to high voltage test mode, generating a high voltage using a test bit data for a high voltage test, generating a reference high voltage, generating a comparison high voltage, comparing the reference high voltage and the comparison high voltage to generate a high voltage code converted into a digital signal, and if the value of the high voltage code represents a stable high voltage, finishing the high voltage test, and if the value of the high voltage code represents an unstable high voltage, changing the test bit data, generating a high voltage again, and performing a test.

DESCRIPTION OF SPECIFIC EMBODIMENTS

Figure 1:
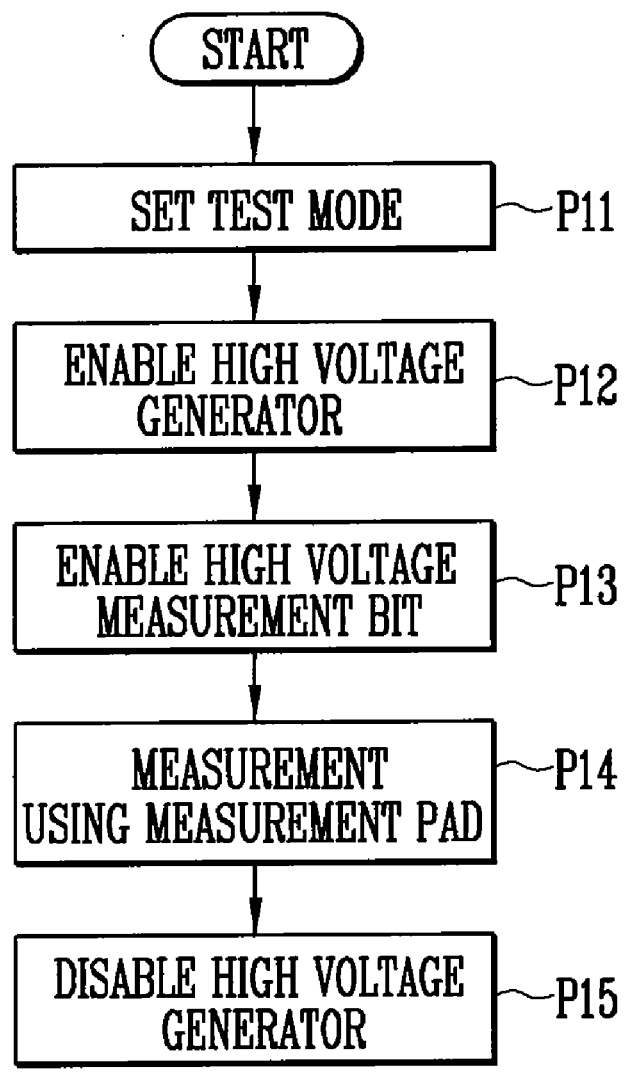
FIG. 1 is a flowchart illustrating a method of measuring a high voltage of a conventional semiconductor device.
Figure 2:
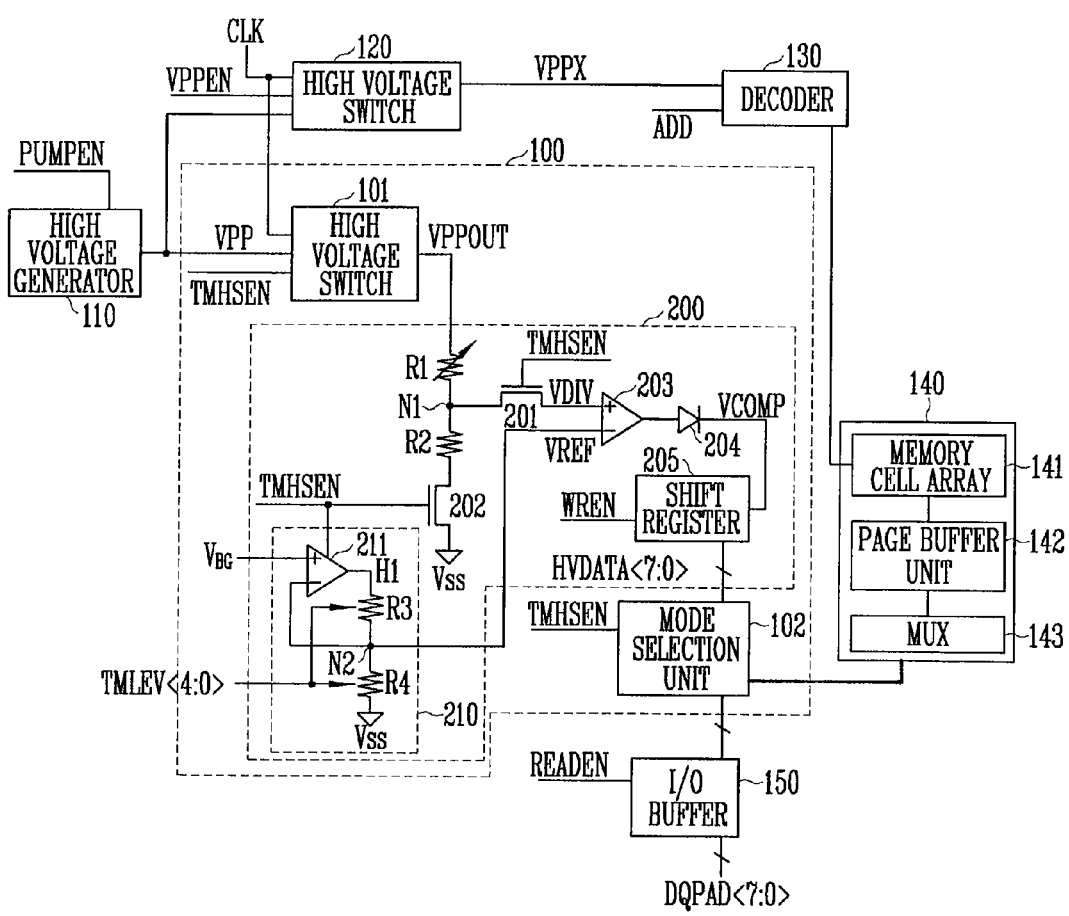
FIG. 2 is a circuit diagram of a semiconductor memory device according to an embodiment of the present invention.

FIG. 2 is a circuit diagram of a semiconductor memory device according to an embodiment of the present invention.

Referring to FIG. 2, a semiconductor device includes a high voltage generator 110, a high voltage switch 120, a decoder 130, a memory unit 140, a converter 100 and an I/O buffer 150.

The high voltage generator 110 generates a high voltage VPP in response to a pump enable signal PUMEN. The high voltage switch 120 receives a high voltage VPP according to an external clock CLK when a high voltage enable signal VPPEN is enabled, and generates a general high voltage VPPX. The decoder 130 receives the general high voltage VPPX according to an address ADD, and outputs it to the memory unit 140.

The memory unit 140 includes a memory cell array 141, a page buffer unit 142 and a MUX 143. The memory cell array 141 includes a plurality of memory cell strings (not shown). Each of the memory cell strings (not shown) includes a plurality of memory cells (not shown) that uses a high voltage received from the decoder 130. The page buffer unit 142 includes a plurality of page buffers (not shown), and it serves to program data into the memory cell array 141 and is used at the time of a read operation. The MUX 143 reads data from the page buffer unit 142 and outputs the read data, or applies program data.

The converter 100 includes a high voltage switch 101, an analog conversion circuit 200 and a mode selection unit 102. The high voltage switch 101 receives the high voltage VPP from the high voltage generator 110 in response to a mode select signal TMHSEN, and generates a test high voltage VPPOUT. The analog conversion circuit 200 receives the test high voltage VPPOUT and a test bit data TMLEV, which are analog signals, and outputs a high voltage data HVDATA converted into a digital signal.

The analog conversion circuit 200 includes resistors R1 and R2, NMOS transistors 201 and 202, an AD comparator 203, a diode 204, a shift register 205 and a reference voltage generating unit 210. The resistors R1 and R2 are connected in series between the high voltage switch 101 and the NMOS transistor 202. A node N1 is connected between the resistors R1 and R2. To the node N1 is applied a high voltage divided by the resistors R1 and R2. The voltage applied to the node N1 is applied to the NMOS transistor 201. When the mode select signal TMHSEN is enabled, the NMOS transistor 201 is turned on to transfer a comparison high voltage VDIV to the AD comparator 203. When the mode select signal TMHSEN is enabled, the NMOS transistor 202 transfers a voltage, which is received from the resistor R2, as a ground voltage Vss.

The reference voltage generating unit 210 includes a reference voltage comparator 211 and variable resistors R3 and R4. When the mode select signal TMHSEN is enabled, the reference voltage comparator 211 compares a reference voltage $V_{BG}$ and a reference voltage VREF, and output an output signal H1. The variable resistors R3 and R4 are connected in series between the reference voltage comparator 211 and the ground voltage Vss. The variable resistors R3 and R4 divide the output signal H1, and apply the result to the reference voltage comparator 211 again. At this time, the reference voltage VREF can be changed by controlling the test bit data TMLEV. That is, the reference voltage VREF has a voltage level ranging from 0.8 to 1.2 V on tech depending on the output signal H1 of the comparator 211. If the range is exceeded, it is determined that the measurement of the high voltage is impossible, and a chip can be treated as a fail. The mode selection unit 102 selects a high voltage measurement node or a general mode according to the mode select signal TMHSEN.

The AD comparator 203 compares the comparison high voltage VDIV and the reference voltage VREF, and outputs a comparison voltage VCOMP. The comparison voltage VCOMP is applied to the shift register 205 through the diode 204

The shift register 205 receives the comparison voltage VCOMP on a bit basis when the write signal WREN is enabled, and stores the received comparison voltage VCOMP. In the case where the number of the shift register 205 is plural, each of the plurality of shift registers 205 stores the comparison voltage VCOMP, and outputs a plurality of high voltage data HVDATA<n:0>.

The mode selection unit 102 receives data from the test high voltage circuit when the mode select signal TMHSEN is enabled, and receives data from the memory unit 140 when the mode select signal TMHSEN is disabled.

The I/O buffer 150 receives a plurality of data from the mode selection unit 102. The I/O buffer 150 outputs the data of the memory unit 140 according to the mode select signal, or outputs the output code generated from the converter 100 through the I/O terminal DQPAD.

A method of measuring a high voltage using the semiconductor memory device constructed above is described below.

If the mode select signal TMHSEN is enabled, the mode selection unit 102 switches from the general mode to the test mode. The high voltage switch 101 is prepared to receive the high voltage. The reference voltage generating unit 210 receives the test bit data TMLEV on a bit basis. The high voltage generator 110 generates the high voltage when the pump enable signal PUMPEN is enabled. The high voltage switch receives the high voltage from the high voltage generator 101 according to the external clock CLK, and generates the test high voltage VPPOUT.

Since the mode select signal TMHSEN is enabled and the NMOS transistor 202 is turned on, the test high voltage VPPOUT is divided by the resistors R1 and R2. The divided voltage, which has been lowered to approximately the same level as the reference voltage, is applied to the node N1, and is output as the comparison high voltage VDIV through the NMOS transistor 201. The level of the comparison high voltage VDIV can be expressed in the following Equation.

$$VDIV = \frac{R2}{R1 + R2} * VPP$$

That is, the level of the high voltage VPP to be measured by the resistors R1 and R2 is lowered to the level of the comparison high voltage VDIV. This process corresponds to a process of setting the voltage level, which will be measured, to be the same as the reference voltage for comparison in order to lower the level of the high voltage generated from the high voltage switch 101 for test. At this time, the NMOS transistor 201 is always turned on in the test mode since the mode select signal TMHSEN is enabled.

The reference voltage generating unit 210 receives the plurality of test bit data TMLEV<4:0> and controls the resistance values of the variable resistors R3 and R4. That is, the level of the reference voltage is set. For example, assuming that the test bit TMLEV<4:0> value of 5 bits is obtained, the reference voltage VREF for the test bit TMLEV<4:0> can be listed as follows.

| TMLEV<4:0> | VREF LEVEL (V) |
|---|---|
| 00000 | 1.0 |
| 00001 | 1.01 |
| 00010 | 1.02 |
| 00011 | 1.03 |
| ... | ... |
| 10000 | 0.99 |
| 10001 | 0.98 |
| ... | ... |
| 11110 | 0.85 |
| 11111 | 0.84 |

As can be seen from the above table, the values of the resistors R3 and R4 are changed according to the test bit data TMLEV<4:0>. Accordingly, the level of the reference voltage VREF is changed.

The reference voltage comparator 211 compares the reference voltage $V_{BG}$ and the voltage H1 applied to the node N2, and outputs the output voltage H2. At this time, the output voltage H2 output from the reference voltage comparator 211 is divided by the variable resistors R3 and R4, and is thus output at a lowered level.

The AD comparator 203 compares the level of the comparison high voltage VDIV to be tested, and the level of the reference voltage VREF, and generates the comparison voltage VCOMP. The comparison voltage VCOMP is output as logic high (referred to as "1") when the level of the reference voltage VREF is lower than that of the comparison high voltage VDIV, and is output as logic low (referred to as "0") when the level of the reference voltage VREF is higher than that of the comparison high voltage VDIV.

If the write signal WREN is enabled, the shift register 204 receives the comparison voltage VCOMP, and stores it in the register. There can be more than one shift register 205. If the number of the shift registers is plural, the shift registers receive the comparison voltage VCOMP by as many times as the number of the shift registers. For example, when the number of the shift register 205 is eight, the reference voltage generating unit 210 receives the same test bit data TMLEV eight times. The reference voltage comparator 211 sequentially generates the level of the comparison voltage VCOMP eighth times, and applies the generated voltages to the shift register 205. The plurality of shift registers 205 stores the comparison voltages VCOMP in the shift registers 205, respectively, whenever the write signal WREN is enabled, and outputs the plurality of high voltage data HVDATA<7:0>.

The mode selection unit 102 receives the high voltage data HVDATA, and outputs it to the I/O buffer 150. If the read signal READEN is enabled, the I/O buffer 150 receives a digital code output from the mode selection unit 102, and outputs it to the I/O terminal DQPAD.

For example, if a code "00000000" is output to the I/O terminal DQAPAD<7:0>, it can be seen that the code is a valid high voltage state. In contrast, if another data is output from at least one of the I/O terminals DQAPAD<7:0>, it is determined that the data is a high voltage having noise and is a fail. That is, if the write signal WREN is toggled eight times, the comparison voltages VCOMP are stored in the shift register 205 one by one. This is for the purpose of obtaining an average value several times since that the measurement values may vary due to noise generated during the test.

If a code "00001000" is output to the I/O terminal DQAPAD<7:0>, it can be seen that "1" is generated due to noise. It is determined that all values output to the I/O terminal DQPAD are correct value when they are all output as "0" or "1". Accordingly, the bits of a minority group may be seen as having been generated by noise. For example, if a code is "11001000," the bits of the minority group "1" may be assumed to be noise.

Therefore, the status of the high voltage can be tested using a code output through the I/O terminal DQPAD. Thus, a high voltage test is possible even after a packaging process.

Figure 3:
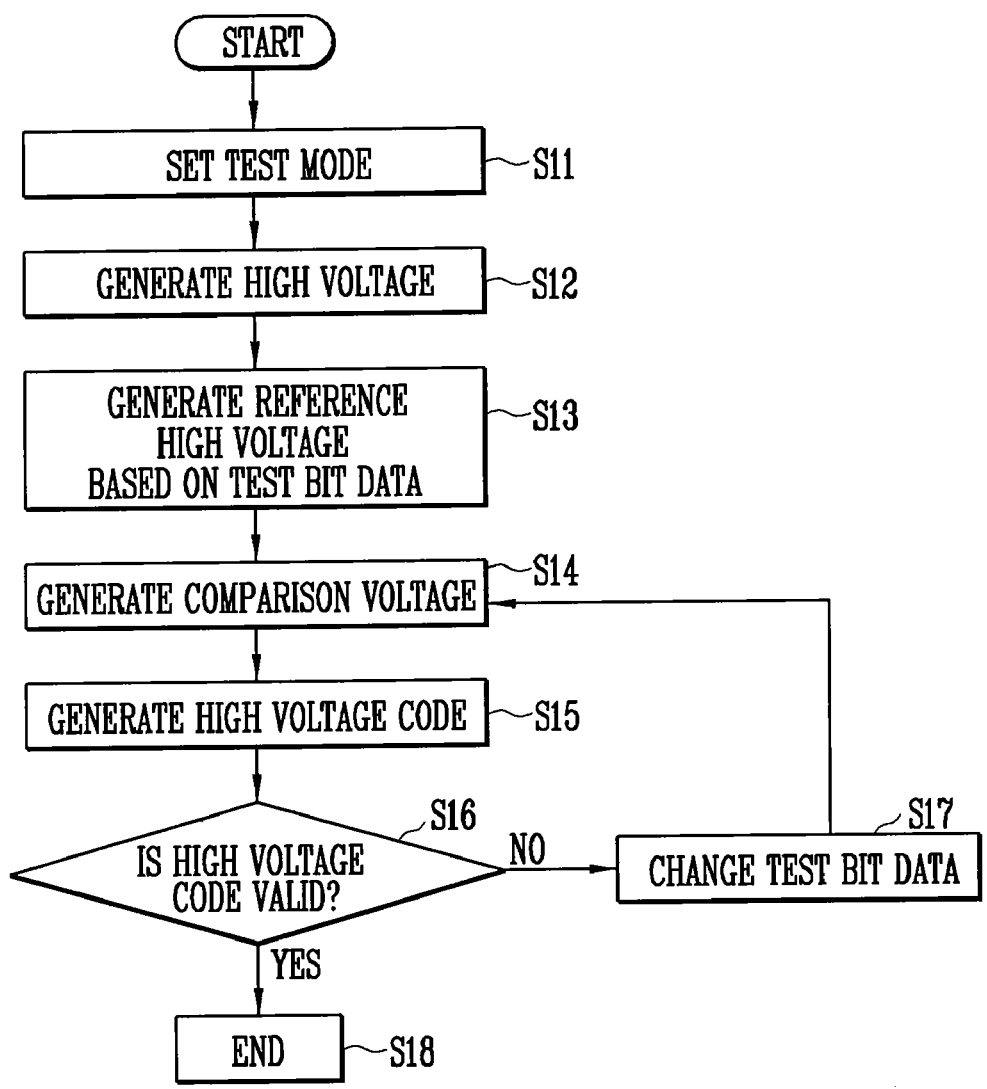
FIG. 3 is a flowchart illustrating a method of measuring a high voltage using the semiconductor memory device shown in FIG. 2.

FIG. 3 is a flowchart illustrating a method of measuring a high voltage using the semiconductor memory device shown in FIG. 2.

In the present invention, a new test high voltage circuit is included in the semiconductor device in order to facilitate the measurement of a high voltage. A method of measuring a high voltage in the semiconductor device having a measurement function is sequentially described as follows.

A semiconductor device whose high voltage will be tested is set to the test mode at step S11. In order to read high voltage measurement data (not data generated from a main chip) through the I/O terminal, an output terminal is changed to a measurement data circuit unit, and the test high voltage circuit is enabled to generate a high voltage at step S12. A reference high voltage is generated based on a test bit data received on a bit basis S13. The high voltage and a reference high voltage are compared with each other, and a comparison voltage is generated.

If the level of the reference voltage is higher than that of the high voltage, the value of "1" is output. If the level of the reference voltage is higher than that of the high voltage, the value of "0" is output as the comparison voltage at step S14. The output comparison voltage is sequentially applied according to a write signal, and is stored in the register in code form at step S15. A high voltage code is output through the I/O terminal. It is determined whether the high voltage code, which is measured through averaging, is valid at step S16.

If, as a result of the determination, the high voltage code is not valid, the test bit data is changed and the reference high voltage is generated at step S17. The high voltage is compared with the reference high voltage again, and a comparison voltage is generated S14. The high voltage code generation process is repeatedly performed. If, as a result of the determination, the high voltage code is valid, the measurement of the high voltage is completed at step S18.

Figure 4:
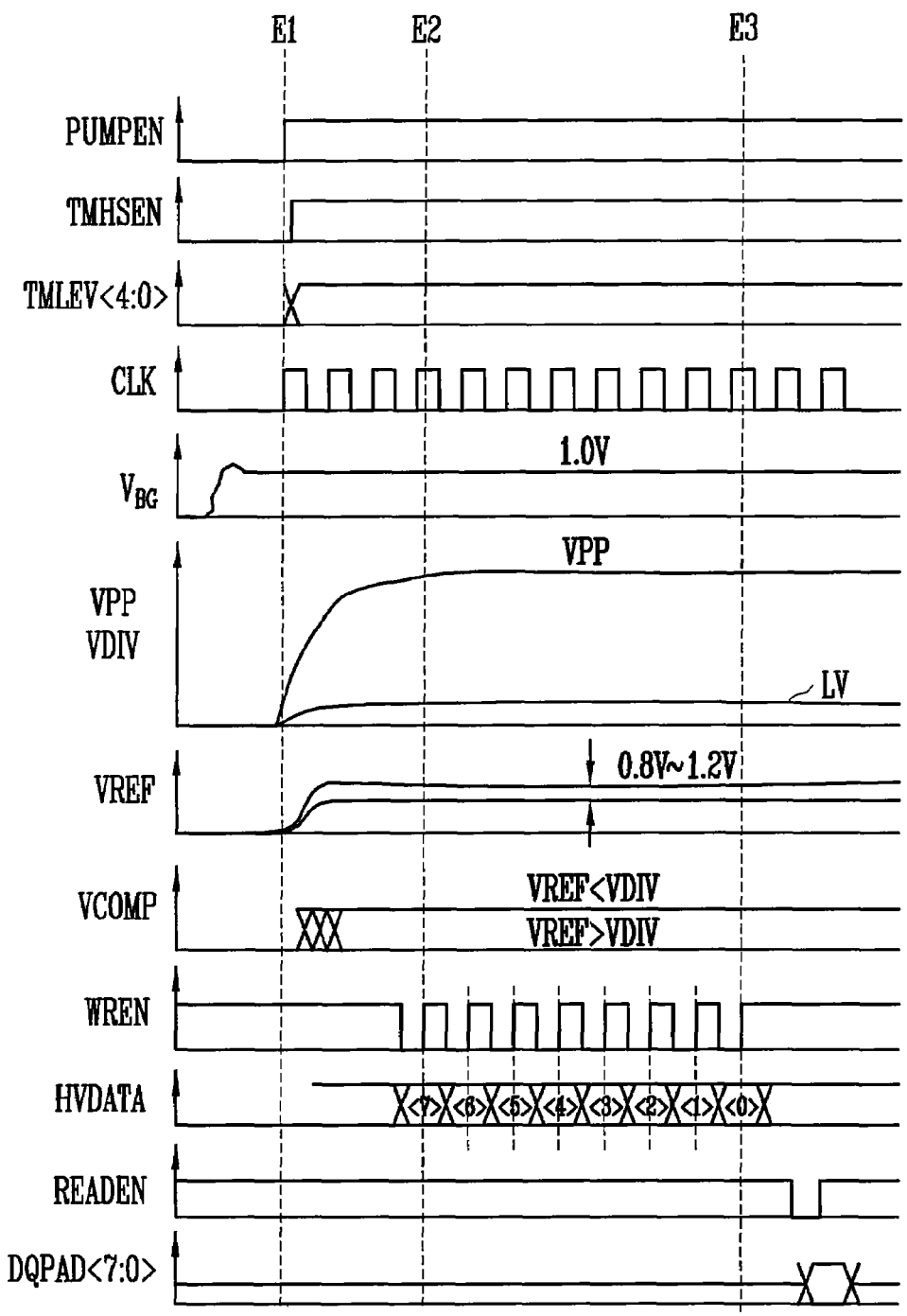
FIG. 4 is a timing diagram for illustrating the operation of the semiconductor memory device shown in FIG. 2.

FIG. 4 is a timing diagram for illustrating the operation of the semiconductor memory device shown in FIG. 2.

In a period E1, in order to set the high voltage test mode, the mode select signal TMHSEN and the pump enable signal PUMPEN are enabled. Then, the high voltage VPP is applied to the converter 100. At this time, the level of the high voltage VPP to be measured is lowered for a high voltage test (LV). If test bit data for a reference voltage output is applied, the level of the reference voltage VREF is controlled by the resistors. The level of the reference voltage VREF ranges from 0.8 to 1.2 V.

The comparison high voltage VDIV and the reference voltage VREF are compared, and the comparison voltage VCOMP is output. The reference voltage VREF can be output as different levels according to the test bit signal TMLEV. When the level of the reference voltage VREF is lower than that of the reference voltage VDIV, the comparison voltage VCOMP of logic high is output. When the level of the reference voltage VREF is higher than that of the reference voltage VDIV, the comparison voltage VCOMP of logic high is output.

In periods E2 to E3, whenever the write signal WREN is enabled, the shift register 205 sequentially receives the comparison voltage VCOMP, and sequentially stores the high voltage data HVDATA. The read voltage REANEN remains enabled while the write signal WREN is enabled, so that measured data can be immediately output to the I/O terminal DQPAD.

According to the semiconductor memory device described above, even after the semiconductor device is packaged, whether a high voltage circuit is abnormal or not, the output level of the high voltage circuit can be tested easily. Accordingly, the packaging of a semiconductor device does not have to be damaged, and the test time of a high voltage can be shortened.

The above embodiments of the present invention are illustrative and various alternatives are possible. Other additions, subtractions, or modifications are obvious in view of the present disclosure and are intended to fall within the scope of the appended claims.

What is claimed is:

1. A semiconductor memory device, comprising:
a high voltage generator to generate a high voltage and apply the generated high voltage to a memory unit;
a converter to convert an output voltage of the high voltage generator into a digital signal; and
a mode selection unit to output selectively an output of the converter or an output of the memory unit through an I/O terminal.

2. The semiconductor memory device of claim 1, wherein the converter comprises:

a high voltage switch to output the output voltage of the high voltage generator as a test high voltage in response to a mode select signal;

a reference voltage generating unit to generate a reference voltage according to test bit data in response to the mode select signal;

a comparator to compare the test high voltage and the reference voltage, and output a comparison voltage, the comparison voltage being a digital signal; and a shift register to store the comparison voltage.

3. The semiconductor memory device of claim 2, wherein the reference voltage generating unit comprises:

a reference voltage comparator to output a reference output voltage in response to the mode select signal; and variable resistors to control the reference voltage according to the test bit data.

4. The semiconductor memory device of claim 2, wherein the comparator compares third and fourth voltages and outputs a comparison voltage of "1" or "0", the third and fourth voltage being analog signals and the comparison voltage being a digital signal.

5. The semiconductor memory device of claim 2, wherein the shift register is at least one in number, and the shift registers store bits of the comparison voltage, respectively, one by one.

6. A high voltage test method of a semiconductor memory device, the method comprising:

changing a data mode to a high voltage test mode when a mode select signal is enabled;

generating a high voltage using a test bit data for a high voltage test;

generating a reference high voltage;

generating a comparison high voltage;

comparing the reference high voltage and the comparison high voltage to generate a high voltage code converted into a digital signal; and ending the high voltage test if the value of the high voltage code represents a stable high voltage, and changing the test bit data, generating a high voltage again, and performing a test if the value of the high voltage code represents an unstable high voltage.

7. The high voltage test method of claim 6, wherein the stable high voltage code value has all "0".

8. The high voltage test method of claim 6, wherein the stable high voltage code value has all "1".

9. The high voltage test method of claim 6, wherein the unstable high voltage code value has at least one of measurement values that is a different value.

* * * * *